United States Patent
Koto

(10) Patent No.: US 7,088,142 B2
(45) Date of Patent: Aug. 8, 2006

(54) SEMICONDUCTOR INTEGRATED CIRCUIT AND LEVEL CONVERSION CIRCUIT

(75) Inventor: Tomohiko Koto, Kasugai (JP)

(73) Assignee: Fujitsu Limited, Kawasaki (JP)

(*) Notice: Subject to any disclaimer, the term of this patent is extended or adjusted under 35 U.S.C. 154(b) by 28 days.

(21) Appl. No.: 10/809,894

(22) Filed: Mar. 26, 2004

(65) Prior Publication Data

US 2005/0088202 A1   Apr. 28, 2005

(30) Foreign Application Priority Data

Oct. 23, 2003   (JP) ............................. 2003-363136

(51) Int. Cl.
*H03K 19/0175* (2006.01)
(52) U.S. Cl. ..................... 326/83; 326/81; 326/68; 326/80; 327/333
(58) Field of Classification Search ................ 326/62, 326/63, 68, 80, 81, 83, 115, 121
See application file for complete search history.

(56) References Cited

U.S. PATENT DOCUMENTS

| | | | | |
|---|---|---|---|---|
| 5,900,745 A | * | 5/1999 | Takahashi | 326/64 |
| 6,111,431 A | * | 8/2000 | Estrada | 326/83 |
| 6,114,875 A | * | 9/2000 | Gerber et al. | 326/80 |
| 6,466,054 B1 | * | 10/2002 | Kameyama et al. | 326/68 |
| 6,476,637 B1 | * | 11/2002 | Brownlow et al. | 326/81 |
| 6,590,422 B1 | * | 7/2003 | Dillon | 326/86 |
| 6,774,695 B1 | * | 8/2004 | Hayashi et al. | 327/333 |
| 6,833,739 B1 | * | 12/2004 | Isoda | 327/108 |
| 6,900,663 B1 | * | 5/2005 | Roper et al. | 326/83 |
| 2003/0085736 A1 | * | 5/2003 | Tinsley et al. | 326/81 |

FOREIGN PATENT DOCUMENTS

JP   2773692   4/1998

* cited by examiner

*Primary Examiner*—Vibol Tan
(74) *Attorney, Agent, or Firm*—Arent Fox PLLC

(57) ABSTRACT

A semiconductor integrated circuit for decreasing level fluctuation in an output signal of a level conversion circuit. The level conversion circuit has a pair of series-connected transistors including a first MOS transistor and a second MOS transistor and a further pair of series-connected transistors including a third MOS transistor and a fourth MOS transistor. The level conversion circuit generates a first output signal from a node connecting the first and second MOS transistors and a second output signal from a node connecting the third and fourth transistors. A differential amplification circuit functions in accordance with the first and second output signals. The first and fourth MOS transistors each have a gate for receiving a first input signal. The second and third MOS transistors each have a gate for receiving a second input signal having a phase inverted from the phase of the first input signal.

15 Claims, 8 Drawing Sheets

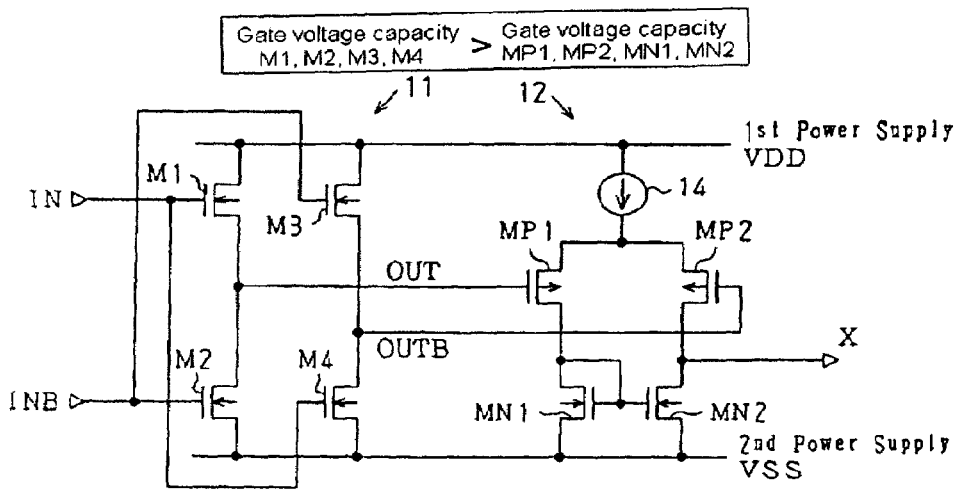
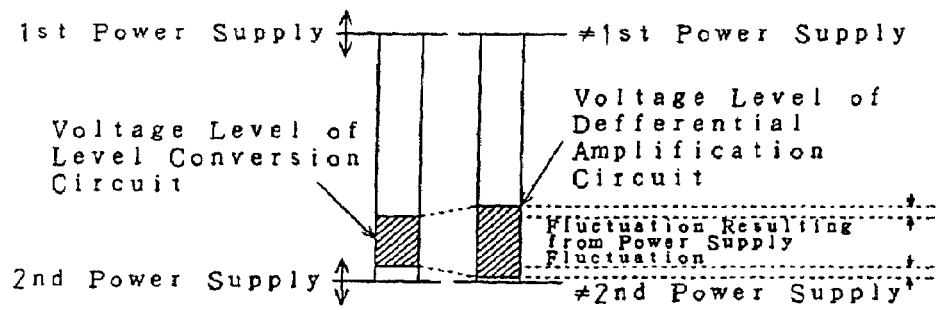
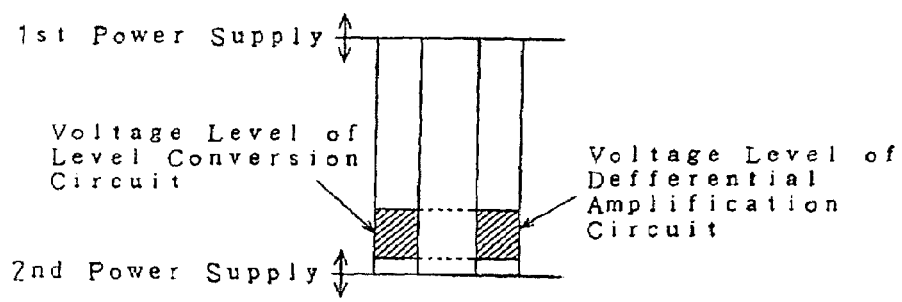

Fig. 15
Gate Oxide Film transistors
M1, M2, M3, M4
Gate Oxide Film transistors
MP1, MP2, MN1, MN2
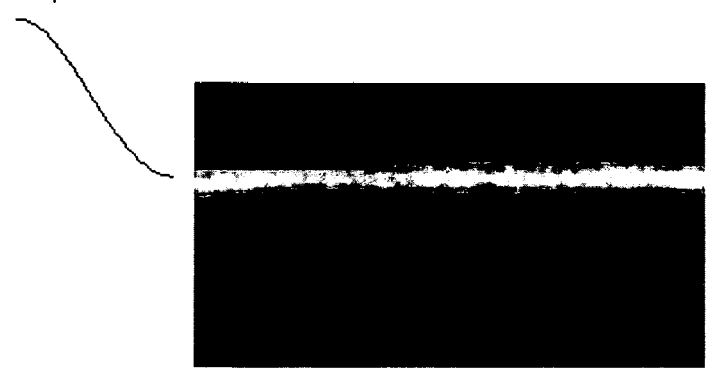

US 7,088,142 B2

SEMICONDUCTOR INTEGRATED CIRCUIT AND LEVEL CONVERSION CIRCUIT

CROSS-REFERENCE TO RELATED APPLICATIONS

This application is based upon and claims the benefit of priority from the prior Japanese Patent Application No. 2003-363136, filed on Oct. 23, 2003, the entire contents of which are incorporated herein by reference.

BACKGROUND OF THE INVENTION

The present invention relates to a level conversion circuit for shifting the voltage level of an input signal to generate an output signal and to a semiconductor integrated circuit incorporating such a level conversion circuit.

An interface circuit that performs communication with a small amplitude signal, such as an emitter coupled logic (ECL), a stub series terminated logic (SSTL), or a low voltage differential signal (LVDS), is know in the prior art. In such an interface circuit, the small amplitude signal must be amplified to convert the small amplitude signal to a signal having a signal level that enables an internal circuit to function. An interface circuit normally includes a differential amplification circuit. In the differential amplification circuit, the circuit characteristics, such as delay time and output level, changes in accordance with the input level. Accordingly, there is a demand for a technique that minimizes fluctuation of the input level.

As one example, Japanese Patent No. 2773692 describes an input circuit that uses a differential amplification circuit. The input circuit functions as an interface circuit provided with a small amplification signal. FIG. 1 is a schematic circuit diagram of such an interface circuit 1.

As shown in FIG. 1, the interface circuit 1 includes a push-pull circuit 2 and a differential amplification circuit 3. The push-pull circuit 2 includes four MOS transistors M1 to M4. The MOS transistors M1 and M2 are connected in series between a first power supply having a high potential and a second power supply having a low potential. The MOS transistors M3 and M4 are also connected in series between the first and second power supplies. An input signal IN is provided to the gates of the MOS transistor M1 and M4. Reference voltage REF is supplied to the gates of the MOS transistors M2 and M3. The push-pull circuit 2 converts the input signal IN to two output signals OUT and OUTB. The output signal OUT is provided to the differential amplification circuit 3 from a node connecting the MOS transistors M1 and M2. The output signal OUTB is provided to the differential amplification circuit 3 from a node connecting the MOS transistors M3 and M4. The output signal OUT and the output signal OUTB are complementary to each other. The differential amplification circuit 3 amplifies the differential voltage between the two output signals OUT and OUTB provided from the push-pull circuit 2 to generate signal X.

SUMMARY OF THE INVENTION

In this manner, in the interface circuit 1, the push-pull circuit 2 converts the single input signal IN to the complementary output signals OUT and OUTB and provides the output signals OUT and OUTB to the differential amplification circuit 3. Due to this circuit configuration, the differential voltage between the output signals OUT and OUTB, which are provided to the differential amplification circuit 3, is ensured even when the amplitude of the input signal is small. This prevents the small amplitude of the input signal from decreasing amplification gain and prevents power consumption from increasing.

As shown in FIG. 2, when the input signal IN provided to the push-pull circuit 2 has a high voltage level (2.4 V) and a low voltage level (1.6 V), the differential voltage between the output signals OUT and OUTB fluctuates every half cycle. This changes the circuit characteristics, such as the delay time or signal level of the output signal X, of the differential amplification circuit 3. As a result, the internal circuit of the semiconductor integrated circuit may not function properly.

The present invention provides a semiconductor integrated circuit and a level conversion circuit that decreases level fluctuation in the output signal of the level conversion circuit so that a differential amplification circuit functions properly.

The present invention provides a semiconductor integrated circuit including a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply. The level conversion circuit generates a first output signal from a node connecting the first and second MOS transistors and a second output signal from a node connecting the third and fourth transistors. A differential amplification circuit, connected to the level conversion circuit, functions in accordance with the first and second output signals of the level conversion circuit. The first and fourth MOS transistors each have a gate for receiving a first input signal, and the second and third MOS transistors each have a gate for receiving a second input signal having a phase inverted from the phase of the first input signal.

A further aspect of the present invention is a semiconductor integrated circuit including a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply. The level conversion circuit generates a first output signal from a node connecting the first and second MOS transistors and a second output signal from a node connecting the third and fourth transistors. A differential amplification circuit, connected to the level conversion circuit, functions in accordance with the first and second output signals of the level conversion circuit. The gate of each transistor has a gate length and a gate width. The ratio between the gate length and the gate width of one of the transistors in each pair of the series-connected MOS transistors is about three times or less than the ratio between the gate length and the gate width of the other one of the transistors in each pair of the series-connected MOS transistors.

A further aspect of the present invention is a level conversion circuit for shifting voltage levels of a first input signal and a second input signal to generate an output signal. The level conversion circuit includes a pair of transistors including a first MOS transistor and a second MOS transistor, connected in series between a first power supply and a second power supply, and a further pair of transistors including a third MOS transistor and a fourth MOS transistor, connected in series between the first power supply and the second power supply. The first and fourth MOS transistors each have a gate for receiving a first input signal, and the second and third MOS transistors each have a gate for receiving a second input signal having a phase inverted from the phase of the first input signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 5 is a schematic circuit diagram of a differential amplification circuit shown in FIG. 3;

FIG. 6A is a diagram showing shifting of signal voltage level caused by power supply fluctuation when the power supply of the differential amplification circuit differs from the power supply of the level conversion circuit;

FIG. 6B is a diagram showing shifting of signal voltage level caused by power supply fluctuation when the power supply of the differential amplification circuit is the same as the power supply of the level conversion circuit;

FIG. 15 illustrates exemplary gate oxide thicknesses of transistors M1–M4 and transistors MP1, MP2, MN1, MN2 of FIG. 5.

DETAILED DESCRIPTION OF THE PREFERRED EMBODIMENTS

Figure 1:
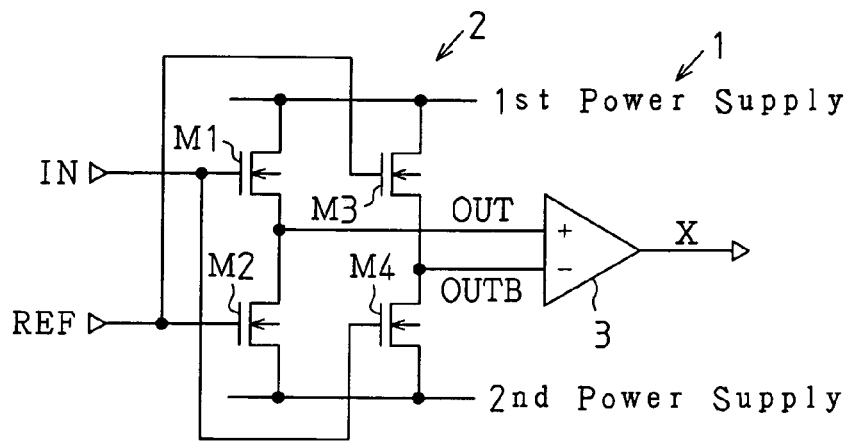
FIG. 1 is a schematic circuit diagram of an interface circuit in the prior art.
Figure 2:
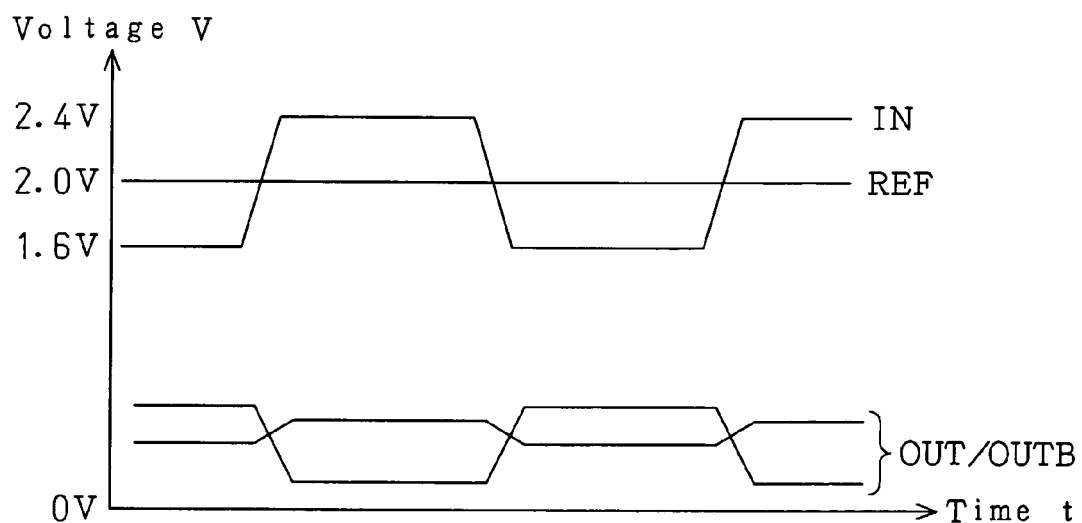
FIG. 2 is a waveform diagram showing signals of a push-pull circuit.

In the drawings, like numerals are used for like elements throughout.

First Embodiment

Figure 3:
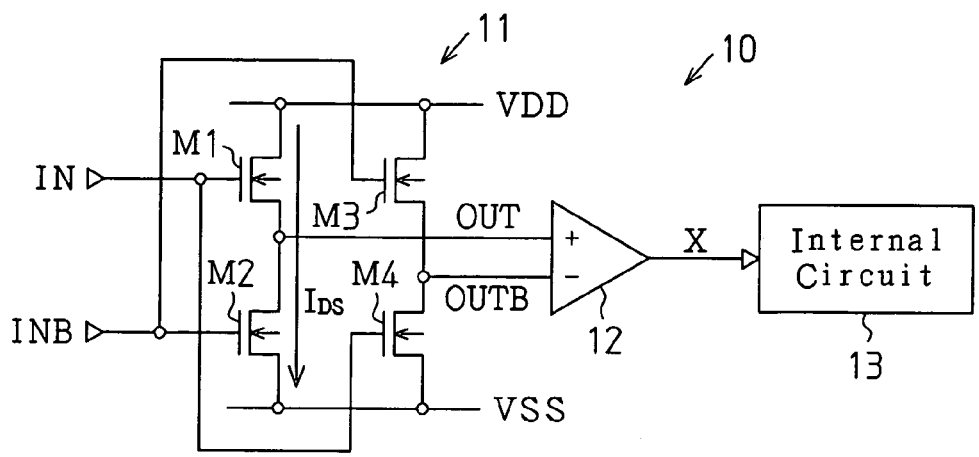
FIG. 3 is a schematic circuit diagram of a semiconductor integrated circuit according to a first embodiment of the present invention.

A semiconductor integrated circuit 10 according to a first embodiment of the present invention will now be discussed with reference to FIGS. 3 to 6. FIG. 3 is a schematic circuit diagram showing a semiconductor integrated circuit 10 of the first embodiment.

The semiconductor integrated circuit 10 includes a level conversion circuit 11 and a differential amplification circuit 12 which function as an input circuit in this first embodiment. The level conversion circuit 11 and the differential amplification circuit 12 converts input signals IN and INB, for example, which are provided from an external device, to a signal X having a voltage level corresponding to the operational power supply of an internal circuit 13.

The level conversion circuit 11 includes first to fourth MOS transistors M1 to M4. Each of the MOS transistors M1 to M4 is an N-type conduction transistor. In the level conversion circuit 11, the first and second MOS transistor M1 and M2 are connected in series between a first power supply VDD at which the potential is high (e.g., 1.2 V) and a second power supply VSS at which the potential is low (e.g., 0 V). Further, the third and fourth MOS transistors M3 and M4 are connected in series between the first and second power supplies VDD and VSS. The gates of the first and fourth MOS transistors M1 and M4 are provided with an input signal IN. The gates of the second and third MOS transistors M2 and M3 are provided with an input signal INB having a phase inverted from that of the input signal IN.

An output signal OUT is provided to the differential amplification circuit 12 from a node connecting the first and second MOS transistors M1 and M2. An output signal OUTB is provided to the differential amplification circuit 12 from a node connecting the third and fourth MOS transistors M3 and M4.

The differential amplification circuit 12 includes a non-inverting input terminal for receiving the output signal OUT and an inverting input terminal for receiving the OUTB. The differential amplification circuit 12 amplifies the differential voltage between the output signals OUT and OUTB to generate and provide the internal circuit 13 with an amplified signal X.

In the level conversion circuit 11 of the first embodiment, the ratio between the gate length L1 and the gate width W1 of the first MOS transistor M1 is designed to be substantially equal to the ratio between the gate length L2 and the gate width W2 of the second MOS transistor M2 (i.e., W1/L1=W2/L2). Further, the ratio between the gate length L3 and the gate width W3 of the third MOS transistor M3 is designed to be substantially equal to the ratio between the gate length L4 and the gate width W4 of the fourth MOS transistor M4 (i.e., W3/L3=W4/L4). By designing the MOS transistors M1 to M4 in this manner, fluctuation of the voltage level of the output signals OUT and OUTB generated by the level conversion circuit 11 is suppressed even if the voltage level of the input signal IN and INB fluctuates.

The operation of the level conversion circuit 11 in the first embodiment will now be discussed.

When a MOS transistor functions in a saturated range, the drain current IDS that flows through the MOS transistor is as represented by equation (1).

$$IDS=\beta/2\times(VGS-VT)^2 \tag{1}$$

In the equation, VGS represents gate-source voltage, VT represents a threshold voltage, and β represents a gain constant of the MOS transistor. Further, the gain constant β is represented by equation (2).

$$\beta = W/L \times \beta O \tag{2}$$

In the equation, W represents the gate width, L represents the gate length, and βO represents a conduction coefficient.

In the level conversion circuit 11 of FIG. 3, the drain current IDS(M1) flowing through the first MOS transistor M1 is substantially equal to the drain current IDS(M2) flowing through the second MOS transistor M2. Accordingly, the relationship of equation (3) is obtained from equation (1).

$$\beta(M1)/2 \times (VGS(M1) - VT(M1))^2 = \beta(M2)/2 \times (VGS(M2) - VT(M2))^2 \tag{3}$$

When MOS transistors of the same conduction type are manufactured in the same process, the MOS transistors have about the same conduction coefficient βO. In addition, the threshold voltage VT is about the same for each of the MOS transistors although the threshold voltage VT slightly differs depending on the back gate voltage. Accordingly, when the ratio between the gate length L and the gate width W of the MOS transistor M1 is substantially equal to the ratio between the gate length L and the gate width W of the MOS transistor M2, the MOS transistors M1 and M2 satisfy the relationship of equation (4).

$$VGS(M1) = VGS(M2) \tag{4}$$

The output signal OUT generated at the node connecting the MOS transistors M1 and M2 has a voltage level obtained by shifting the voltage level of the input signal IN that is applied to the gate of the MOS transistor M1 by an amount corresponding to a voltage level of the input signal INB applied to the gate of the MOS transistor M2 at that point in time. The voltage level is obtained through equation (4). When the voltage level of the input signal IN is V(IN) and the voltage level of the input signal INB is V(INB), the voltage level V(OUT) generated through the level shift is represented by equation (5).

$$V(OUT) = V(IN) - V(INB) \tag{5}$$

When Vswing represents the amplitude of the complementary input signals IN and INB, equation (5) is represented by equation (6).

$$V(OUT) = Vswing \tag{6}$$

In other words, the voltage level V(OUT) of the output signal OUT is substantially the same as the amplitudes of the input signals IN and INB regardless of fluctuation in the voltage level of the input signals IN and INB. As long as the amplitudes of the input signals IN and INB are substantially constant, the relationship of the voltage levels is such that the voltage level V(OUT) of the output signal OUT remains substantially constant even if the voltage level of the input signal fluctuates.

The above relationship is satisfied when the MOS transistors M1 and M2 function in the saturated range.

For example, if the voltage VDS(M2) becomes lower than VGS(M2)−VT when the output signal OUT shifts from a high level to a low level, the second MOS transistor M2 functions in a non-saturated range. In this state, the relationship of equation (6) is not satisfied. In this case, in the non-saturated range, the current-voltage characteristic of the MOS transistor M2 is generally linear and the ON resistance Ron of the MOS transistor M2 is represented by equation (7).

$$Ron = 1/(\beta(VGS(M2) - VT(M2)) \tag{7}$$

Equation (1) shows that the drain current IDS is proportional to the square of the gate-source voltage VGS(M1) of the first MOS transistor M1 in the saturated range. Equation (7) shows that the ON resistance Ron of the MOS transistor M2 is inversely proportional to the gate-source voltage VGS(M2) in the non-saturated range. It is apparent from equations (1) and (7) that the voltage level V(OUT) depends on the voltage level of the input signals IN and INB. The voltage level V(OUT) is represented as shown in equation (8).

$$V(OUT) = \frac{1}{2} \times (VGS(M1) - VT(M1))^2 / (VGS(M2) - VT(M2)) \tag{8}$$

It has become apparent that when a value corresponding to the actually applied condition (i.e., gate-source voltage and threshold voltage) is assigned to equation (8), the dependency of the voltage level V(OUT), which is represented by equation (8), relative to the voltage level of the input signals IN and INB is actually small. Accordingly, from the results of equations (6) and (8), the voltage level V(OUT) generated by the level shift is extremely small with respect to the voltage level of the input signals IN and INB.

The relationship of signal voltage levels will now be discussed with reference to FIG. 4.

Figure 4:
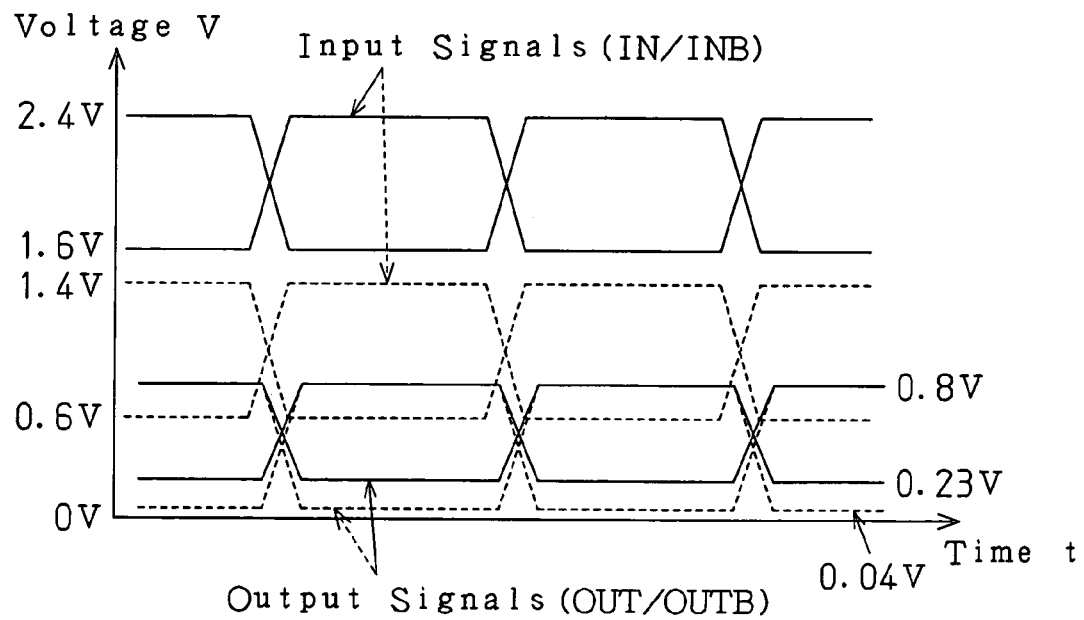
FIG. 4 is a waveform diagram showing signals of a level conversion circuit shown in FIG. 3.

In FIG. 4, the voltage waveform when the input signals IN and INB oscillate at a high level of 2.4 V and a low level of 1.6 V is shown by solid lines. Further, the voltage waveform when the input signals IN and INB oscillate at a high level of 1.4 V and a low level of 0.6 V is shown by broken lines.

As shown in FIG. 4, the high level of the output signals OUT and OUTB is about 0.8 V even if the level conversion circuit 11 is provided with input signals IN and INB having different input levels (IN, INB=2.4/1.6 V or 1.4/0.6 V). The low level of the output signals OUT and OUTB depends slightly on the input level. However, when the input level is 2.4/1.6 V, the low level of the output signals OUT and OUTB is about 0.23 V. When the input level is 1.4/0.6 V, the low level of the output signals OUT and OUTB is about 0.04 V, and the dependency is extremely low.

In this manner, the level conversion circuit 11 of the first embodiment generates output signals OUT and OUTB of which dependencies relative to the voltage levels of the input signals IN and INB are extremely small. Since the output signals OUT and OUTB are provided to the differential amplification circuit 12, changes in characteristics due to the voltage level of the input signals IN and INB are minimized in the differential amplification circuit 12.

FIG. 5 is a schematic circuit diagram of the differential amplification circuit 12.

The differential amplification circuit 12 includes a constant current source 14, PMOS transistors MP1 and MP2, and NMOS transistors MN1 and MN2. The level conversion circuit 11 provides the gate of the PMOS transistor MP1 with the output signal OUT and the gate of the PMOS transistor MP2 with the output signal OUTB.

The constant current source 14 is connected between the first power supply VDD and the PMOS transistors MP1 and MP2. The constant current source 14 supplies the sources of the PMOS transistors MP1 and MP2 with constant current. The drain of the PMOS transistor MP1 is connected to the drain of the NMOS transistor MN1. The drain of the PMOS transistor MP2 is connected to the drain of the NMOS transistor MN2. The drain of the NMOS transistor MN1 is connected to the gates of the NMOS transistors MN1 and MN2. The sources of the NMOS transistors MN1 and MN2 are connected to the second power supply VSS. The differential amplification circuit 12 generates signal X at a node connecting the drain of the PMOS transistor MP2 and the drain of the NMOS transistor MN2.

The differential amplification circuit 12 of the first embodiment is connected to the first and second power supplies VDD and VSS in the same manner as the level conversion circuit 11 and functions using the power supplies VDD and VSS as operational power supplies. This prevents the voltage fluctuation of the power supplies VDD and VSS from affecting the operation characteristics in an undesirable manner.

Unlike the first embodiment, if the power supply of the differential amplification circuit 12 differs from the power supply of the level conversion circuit 11, voltage fluctuation of the power supplies VDD and VSS may affect the operation characteristics in an undesirable manner. For example, when noise fluctuates the power supply voltage, the voltage levels (input signal voltage level) of the output signals OUT and OUTB in the differential amplification circuit 12 fluctuate with respect to the voltage level (output signal voltage level) of the output signals OUT and OUTB in the level conversion circuit 11 as shown in FIG. 6A. Further, the voltage levels of the output signals OUT and OUTB fluctuate when the voltage supplied from an external power supply fluctuates within a standardized range. However, in the first embodiment, the level conversion circuit 11 and the differential amplification circuit 12 are connected to the same first power supply VDD and second power supply VSS. Accordingly, fluctuation of the voltage level is suppressed as shown in FIG. 6B.

In the first embodiment, the gate oxide film of each of the MOS transistors M1 to M4 in the level conversion circuit 11 is thicker than the gate oxide film of each of the MOS transistors MP1, MP2, MN1, and MN2 in the differential amplification circuit 12, as shown in FIG. 15. Thus, the gate voltage capacity of the MOS transistors M1 to M4 is higher than the gate voltage capacity of the MOS transistors MP1, MP2, MN1, and MN2 as shown in FIG. 5. More specifically, the MOS transistors M1 to M4 of the level conversion circuit 11 have a gate voltage capacity of 2.5 V. The MOS transistors MP1, MP2, MN1, and MN2 of the differential amplification circuit 12 have a gate voltage capacity of 1.2 V.

In such a configuration, even when the gates of the NMOS transistors M1 to M4 receive the input signals IN and INB having voltage (2.4 V) that is greater than the voltage of the first power supply VDD at which the potential is high (1.2 V), the input signal IN and INB are converted to signals OUT and OUTB having voltage corresponding to the amplitude of the input signals IN and INB.

The semiconductor integrated circuit 10 of the first embodiment has the advantages described below.

(1) In the level conversion circuit 11, the gates of the first and fourth MOS transistors M1 and M4 are provided with the input signal IN and the gates of the second and third MOS transistors M2 and M3 are provided with the input signal INB having a phase that is inverted from the phase of the input signal IN. Since the level conversion circuit 11 receives the two complementary input signals IN and INB, the output signals OUT and OUTB generated by the level conversion circuit 11 oscillate at a generally constant voltage level. In addition, the differential voltage between the output signal OUT and the output signal OUTB in the level conversion circuit 11 is greater than the differential voltage of the prior art circuit. Accordingly, the level conversion circuit 11 enables the differential amplification circuit 12 to function properly.

(2) In the level conversion circuit 11, the ratio between the gate length and the gate width of the MOS transistors M1 and M3 is substantially equal to the ratio between the gate length and gate width of the MOS transistors M2 and M4. Due to such a design, the voltage levels of the output signals OUT and OUTB remain substantially constant even when the voltage levels of the input signals IN and INB provided to the level conversion circuit 11 fluctuate. In this manner, the level conversion circuit 11 prevents fluctuation of the input level of the differential amplification circuit 12. Accordingly, changes in circuit characteristics, such as the delay time of the output signal and the voltage level, are suppressed in the differential amplification circuit 12.

(3) The level conversion circuit 11 and the differential amplification circuit 12 are connected to the same first power supply VDD and second power supply VSS. Accordingly, level fluctuation of the output signals OUT and OUTB between the level conversion circuit 11 and the differential amplification circuit 12 due to power supply fluctuation is suppressed.

(4) The gate voltage capacity of the MOS transistors M1 to M4 is greater than the voltage of the first power supply VDD. Accordingly, the level conversion circuit 11 enables level conversion of an input signal having voltage in a wider range. To increase the gate voltage capacity of the MOS transistors M1 to M4, the thickness of the gate oxide film be increased by a uniform amount in each of the MOS transistors. In this case, the circuit characteristics are hardly affected by the increase in the gate voltage capacity.

(5) The level conversion circuit 11 is provided with the complementary input signals IN and INB. Thus, one of the transistors in each pair of series-connected MOS transistors (M1 and M2 or M3 and M4) has a high ON resistance and the other one of the transistors in the series-connected MOS transistor has a low ON resistance. That is, in the level conversion circuit 11, a series-connected circuit including a MOS transistor having a high ON resistance and a MOS transistor having a low ON resistance is always configured even when the signal levels of the input signals IN and INB are inverted. This reduces current consumption in the level conversion circuit 11.

Second Embodiment

A semiconductor integrated circuit 10 according to a second embodiment of the present invention will now be discussed.

Figure 7:
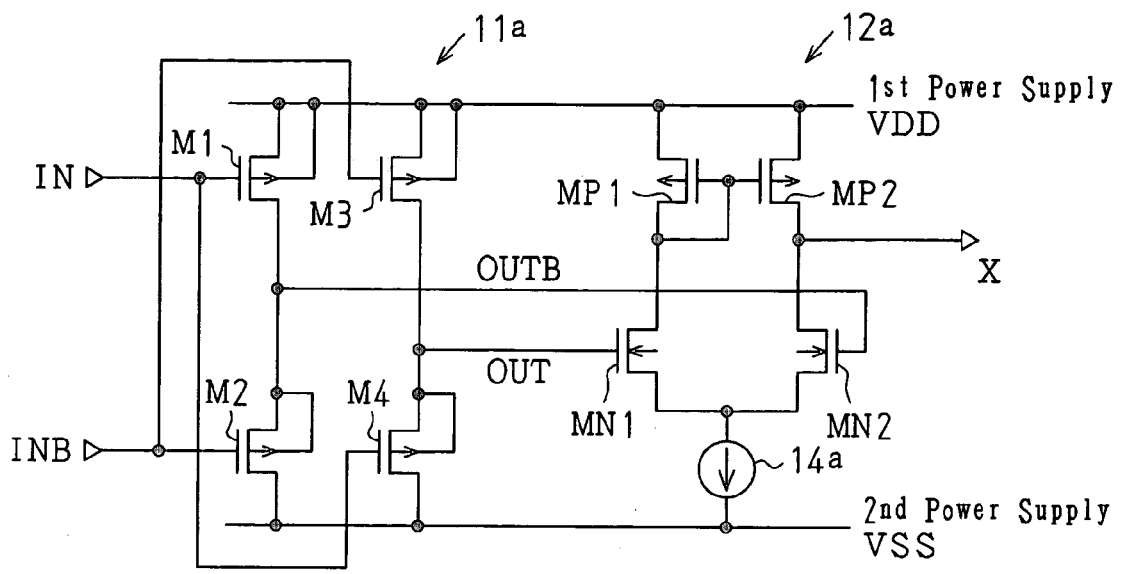
FIG. 7 is a schematic circuit diagram of a level conversion circuit and a differential amplification circuit according to a second embodiment of the present invention.

FIG. 7 shows a level conversion circuit 11a and a differential amplification circuit 12a incorporated in the semiconductor integrated circuit 10.

In the same manner as in the first embodiment, the level conversion circuit 11a of the second embodiment includes first to fourth MOS transistors M1 to M4. However, the MOS transistors M1 to M4 differ from those of the first embodiment in that they are P-type conduction transistors.

Like the first embodiment, in the level conversion circuit 11a, the first and second MOS transistor M1 and M2 are connected in series between a first power supply VDD at which the potential is high and a second power supply VSS at which the potential is low. Further, the third and fourth MOS transistors M3 and M4 are connected in series between the first and second power supplies VDD and VSS. In each of the first to fourth MOS transistors M1 to M4, the back gate is connected to the source.

The differential amplification circuit 12a includes PMOS transistors MP1 and MP2, NMOS transistors MN1 and MN2, and a constant current source 14a. In the differential amplification circuit 12a, the output signal OUT of the level conversion circuit 11a is provided to the gate of the NMOS transistor MN1, and the output signal OUTB is provided to the gate of the NMOS transistor MN2. The sources of the NMOS transistors MN1 and MN2 are connected to each other, and the node connecting the NMOS transistors MN1 and MN2 is connected to the second power supply VSS via the constant current source 14a. The drain of the NMOS transistor MN1 is connected to the drain of the PMOS transistor MP1. The drain of the NMOS transistor MN2 is connected to the drain of the PMOS transistors MP2. The drain of the PMOS transistors MP1 is connected to the gates of the PMOS transistors MP1 and MP2. The sources of the PMOS transistors MP1 and MP2 are connected to the first power supply VDD. The differential amplification circuit 12a generates the signal X at a node connecting the drain of the NMOS transistor MN2 and the drain of the PMOS transistor MP2.

In the level conversion circuit 11a of the second embodiment, the gain constant β of the first MOS transistor M1 is substantially the same as the gain constant β of the second MOS transistor M2. Further, the gain constant β of the third MOS transistor M3 is substantially the same as the gain constant β of the fourth MOS transistor M4.

The gain constant β of equation (2) is represented by equation (9) in more detail.

$$\beta = W/L \times \epsilon ox \times \mu / tox \qquad (9)$$

In the equation, εox represents the gate oxide film dielectric constant, µ represents the average surface migration rate, and tox represents the gate oxide film thickness.

The values of εox, µ, and tox are determined in a manufacturing process. In the second embodiment, these values are determined when designing the semiconductor integrated circuit 10. The semiconductor integrated circuit 10 is designed so that the gain constants β of the first and second MOS transistors M1 and M2 are substantially equal to each other, and the gain constants β of the third and fourth MOS transistors M3 and M4 are substantially equal to each other. When the gain constant β is substantially the same in this manner, fluctuations caused by level fluctuations of the input signals IN and INB are suppressed in the output signals OUT and OUTB, which are generated by shifting the voltage level.

When designing the level conversion circuit 11a to miniaturize the MOS transistors M1 to M4, the channel length modulation constant of each of the MOS transistors M1 to M4 must be taken into consideration. The channel length modulation constant is a constant resulting from a resistance component between the drain and source that appears in a saturated range of the MOS transistor. When the channel length modulation constant λ is taken into consideration in equation (1), equation (10) is obtained.

$$IDS = \beta/2 \times (VGS - VT)^2 \times (1 + \lambda \times VDS) \qquad (10)$$

Accordingly, when each of the MOS transistors M1 to M4 are miniaturized, the MOS transistors M1 to M4 are preferably designed so that the channel length modulation constant λ is substantially the same in the two MOS transistors M1 and M2, and so that the channel length modulation constant λ is substantially the same in the two MOS transistors M3 and M4. The level fluctuation of the output signals OUT and OUTB are suppressed by designing the channel length modulation constant λ in this manner.

The semiconductor integrated circuit 10 of the second embodiment has the advantages described below.

(6) In the level conversion circuit 11a, the gain constant β is substantially the same in the first and second MOS transistors M1 and M2 and in the third and fourth MOS transistors M3 and M4. Accordingly, fluctuations caused by level fluctuations of the input signals IN and INB are suppressed in the output signals OUT and OUTB, which are generated through level shifting. In this case, even if the levels of the input signals IN and INB fluctuate, the level conversion circuit 11a provides the differential amplification circuit 12a with the output signals OUT and OUTB that are not affected by the level fluctuation. The differential amplification circuit 12a thus functions properly.

(7) The differential amplification circuit 12a is connected to the first and second power supplies VDD and VSS in the same manner as the level conversion circuit 11a. Accordingly, in the same manner as in the first embodiment, the influence on the operation characteristics that would result from voltage fluctuation of the power supplies VDD and VSS is suppressed.

(8) In each of the MOS transistors M1 to M4, the back gate is connected to the source. Thus, the threshold voltage VT in each of the MOS transistors M1 to M4 is not affected by the back gate voltage. Accordingly, when the actual state becomes close to the relationship of equation (4), changes in the characteristics of the differential amplification circuit 12a are suppressed.

(9) In the level conversion circuit 11a, the channel length modulation constant λ is substantially the same in the two MOS transistors M1 and M2, and the channel length modulation constant λ is substantially the same in the two MOS transistors M3 and M4. Accordingly, suppression of the level fluctuation of the output signals OUT and OUTB is further ensured.

Third Embodiment]

A semiconductor integrated circuit 10 according to a third embodiment of the present invention will now be discussed.

Figure 8:
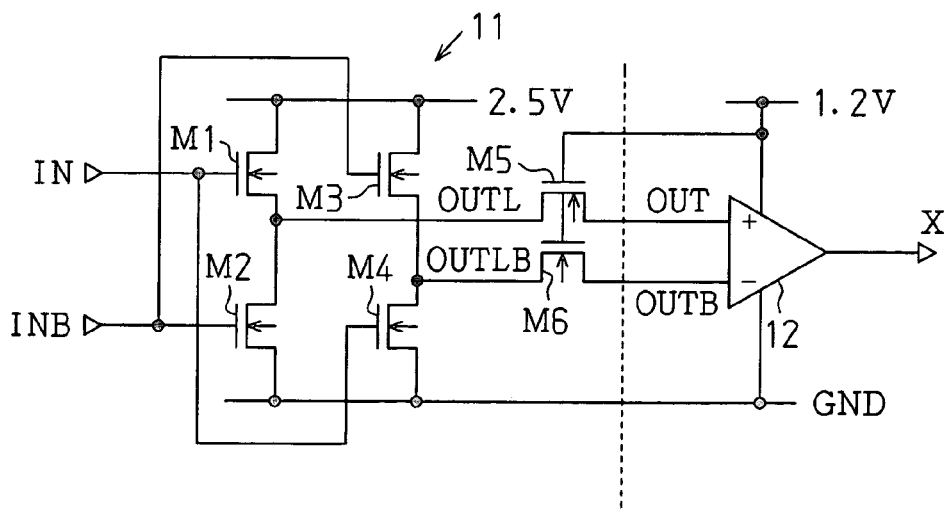
FIG. 8 is a schematic circuit diagram of a level conversion circuit and a differential amplification circuit according to a third embodiment of the present invention.

FIG. 8 shows a level conversion circuit 11 and a differential amplification circuit 12 incorporated in the semiconductor integrated circuit 10 of the third embodiment.

The level conversion circuit 11 of the third embodiment is connected to a power supply that differs from that of the differential amplification circuit 12. More specifically, the level conversion circuit 11 is connected to a first power supply at which the potential is high (2.5 V) and to a second power supply at which the potential is low (0 V). The differential amplification circuit 12 is connected to a third power supply at which the potential is high (1.2 V) and to the second power supply at which the potential is low (0V).

The circuit configuration of the level conversion circuit 11 and the differential amplification circuit 12 is the same as that of the first embodiment. The gate voltage capacity of the first to fourth MOS transistors M1 to M4 in the level conversion circuit 11 is 2.5 V. The gate voltage capacity of the MOS transistors MP1, MP2, MN1, and MN2 (refer to FIG. 5) in the differential amplification circuit 12 is 1.2V.

In the third embodiment, two N-type MOS transistors M5 and M6 are connected between the level conversion circuit 11 and the differential amplification circuit 12. The level conversion circuit 11 provides the differential amplification circuit 12 with an output signal via the MOS transistors M5 and M6. More specifically, a node connecting the first MOS transistor M1 and the second MOS transistor M2 in the level conversion circuit 11 is connected to the non-inverting input terminal of the differential amplification circuit 12 via the MOS transistor M5. A node connecting the third MOS transistor M3 and the fourth MOS transistor M4 is connected to the inverting input terminal of the differential amplification circuit 12 via the MOS transistor M6. The gates of the MOS transistors M5 and M6 are connected to a third power supply of the differential amplification circuit 12 at which the potential is high (1.2 V).

The MOS transistors M5 and M6 between the level conversion circuit 11 and the differential amplification circuit 12 prevent the differential amplification circuit 12 from being provided with signals OUT and OUTB exceeding the gate voltage capacity of the MOS transistors in the differential amplification circuit 12.

Figure 9:
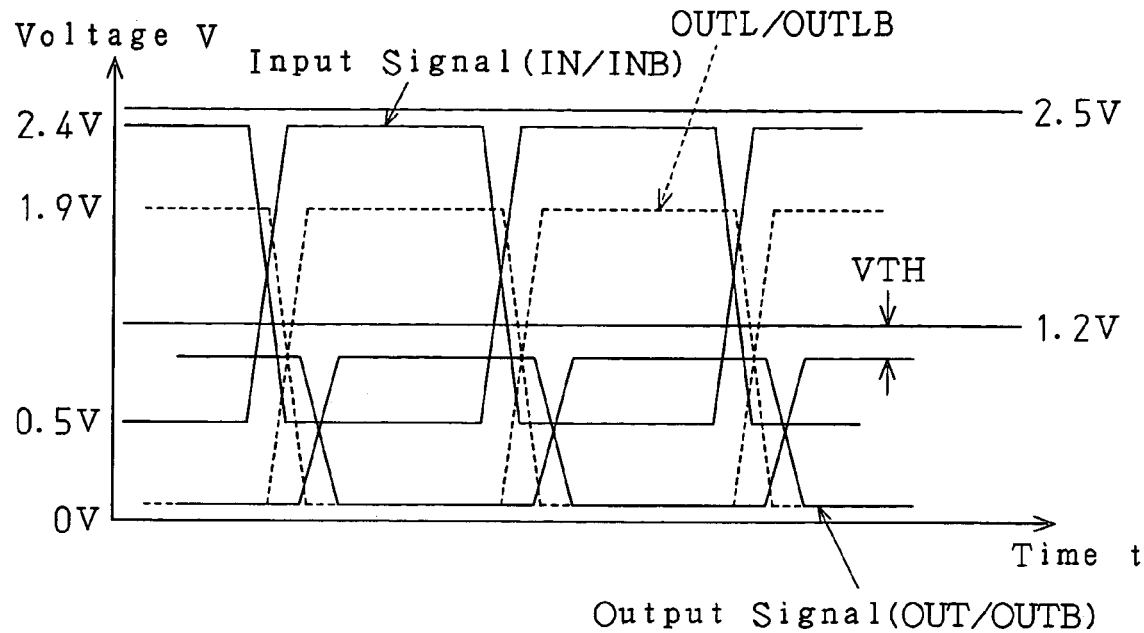
FIG. 9 is a waveform diagram of the level conversion circuit of FIG. 8.

FIG. 9 is a waveform diagram of the third embodiment. The level conversion circuit 11 receives complementary input signals IN and INB that oscillate between a high level (2.4 V) and a low level (0.5 V). In this case, the level conversion circuit 11 shifts the voltage levels of the input signals IN and INB to voltage levels corresponding to the amplitudes of the input signals IN and INB in order to generate output signals OUTL and OUTLB having a high level of 1.9 V. The MOS transistor M5 decreases the voltage of the high level output signal OUTL to generate the output signal OUT. The MOS transistor M6 decreases the voltage of the output signal OUTLB to generate the output signal OUTB. The differential amplification circuit 12 receives the output signals OUT and OUTB generated by the transistors M5 and M6. More specifically, the gate voltage of the MOS transistors M5 and M6 is 1.2V. Thus, the high level of the output signals OUT and OUTB is lower than the gate voltage of the MOS transistors M5 and M6 (1.2 V) by a value corresponding to a threshold voltage VTH.

In this manner, the MOS transistors M5 and M6 set the voltage of the signals OUT and OUTB, which are provided to the differential amplification circuit 12, to 1.2 V-VTH or less. Accordingly, the voltage of the signal provided to the differential amplification circuit 12 does not exceed the gate voltage capacity of the MOS transistors MP1 and MP2 in the differential amplification circuit 12.

Fourth Embodiment

A semiconductor integrated circuit 10 according to a fourth embodiment of the present invention will now be discussed.

Figure 10:
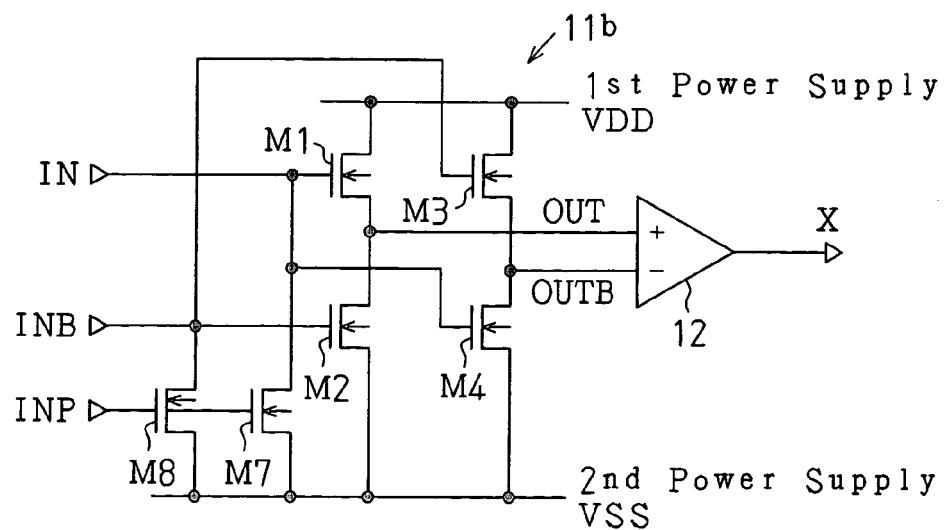
FIG. 10 is a schematic circuit diagram of a level conversion circuit and a differential amplification circuit according to a fourth embodiment of the present invention.

Referring to FIG. 10, a level conversion circuit 11b, which is incorporated in the semiconductor integrated circuit 10 of the fourth embodiment, includes two MOS transistors M7 and M8 in addition to the first to fourth MOS transistors M1 to M4 of the first embodiment. Like the first to fourth MOS transistors M1 to M4, the MOS transistors M7 and M8 are N-type conduction transistors.

The gates of the first and fourth MOS transistors M1 and M4 are connected to the drain of the MOS transistor M7. The source of the MOS transistor M7 is connected to the second power supply VSS. The gates of the second and third MOS transistors M2 and M3 are connected to the drain of the MOS transistor M8. The source of the MOS transistor M8 is connected to the second power supply VSS. The gates of the MOS transistors M7 and M8 are provided with a current restriction signal INP.

When the semiconductor integrated circuit 10 undergoes inspection in the factory, the level conversion circuit 11b is provided with the current restriction signal INP at a high level. The high level current restriction signal INP activates the MOS transistors M7 and M8. In this state, the first to fourth MOS transistors M1 to M4 are inactivated and current does not flow through the first to fourth transistors M1 to M4. Accordingly, the current consumption of the level conversion circuit 11b when inactivated is decreased. Further, in this configuration, the addition of the MOS transistors M7 and M8 do not affect the circuit characteristics in an undesirable manner.

As another way to reduce current, a MOS transistor connected in series to the MOS transistors M1 and M2 and to the MOS transistors M3 and M4 may be arranged in the level conversion circuit 11b for disconnecting the current route of the level conversion circuit 11b. However, such a configuration is not preferable. This is because the addition of the MOS transistor would affect the characteristics of the level conversion circuit 11b in an undesirable manner.

Fifth Embodiment

A semiconductor integrated circuit 10 according to a fifth embodiment of the present invention will now be discussed.

Figure 11:
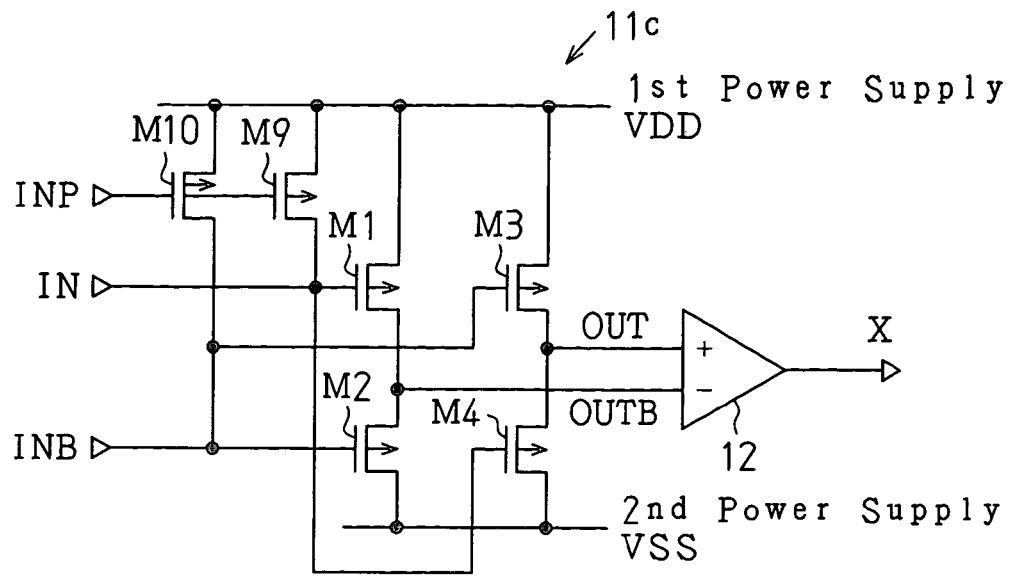
FIG. 11 is a schematic circuit diagram of a level conversion circuit and a differential amplification circuit according to a fifth embodiment of the present invention.

Referring to FIG. 11, a level conversion circuit 11c, which is incorporated in the semiconductor integrated circuit 10 of the fifth embodiment, includes two MOS transistors M9 and M10 in addition to the first to fourth MOS transistors M1 to M4. Like the first to fourth MOS transistors M1 to M4, the MOS transistors M9 and M10 are P-type conduction transistors.

The gates of the first and fourth MOS transistors M1 and M4 are connected to the drain of the MOS transistor M9. The source of the MOS transistor M9 is connected to the first power supply VDD. The gates of the second and third MOS transistors M2 and M3 are connected to the drain of the MOS transistor M10. The source of the MOS transistor M10 is connected to the first power supply VDD. The gates of the MOS transistors M9 and M10 are provided with a current restriction signal INP.

When the level conversion circuit 11c receives the current restriction signal INP at a low level, the MOS transistors M9 and M10 are activated in response to the low level current restriction signal INP. In this state, the first to fourth MOS transistors M1 to M4 are inactivated, and current thus does not flow through the first to fourth MOS transistors M1 to M4. Accordingly, the current consumption of the level conversion circuit 11c when inactivated is decreased. Further, the characteristics of the level conversion circuit 11c is not affected in an undesirable manner.

Sixth Embodiment

A semiconductor integrated circuit 10 according to a sixth embodiment of the present invention will now be discussed.

Figure 12:
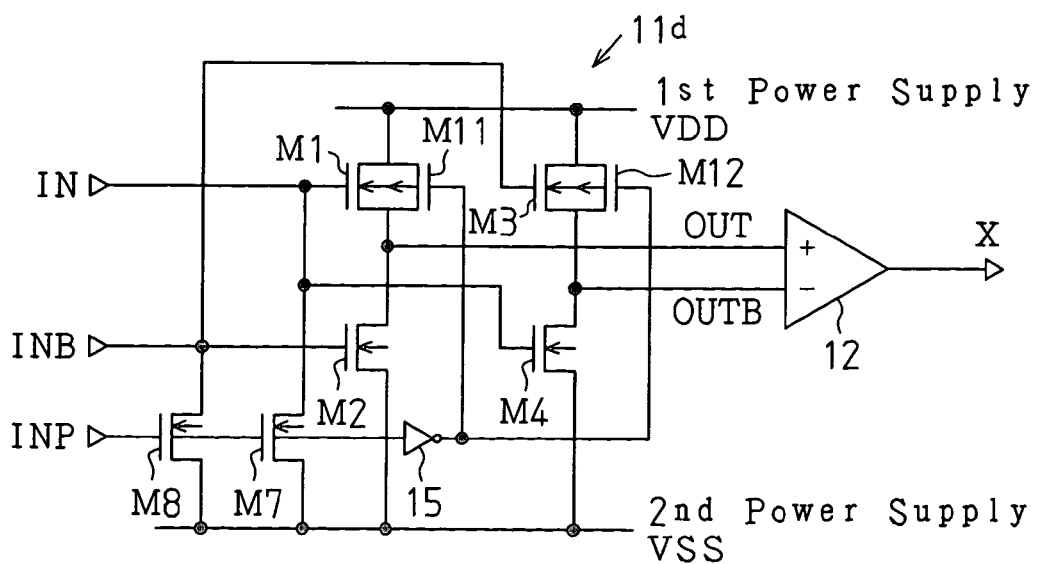
FIG. 12 is a schematic circuit diagram of a level conversion circuit and a differential amplification circuit according to a sixth embodiment of the present invention.
Figure 13:
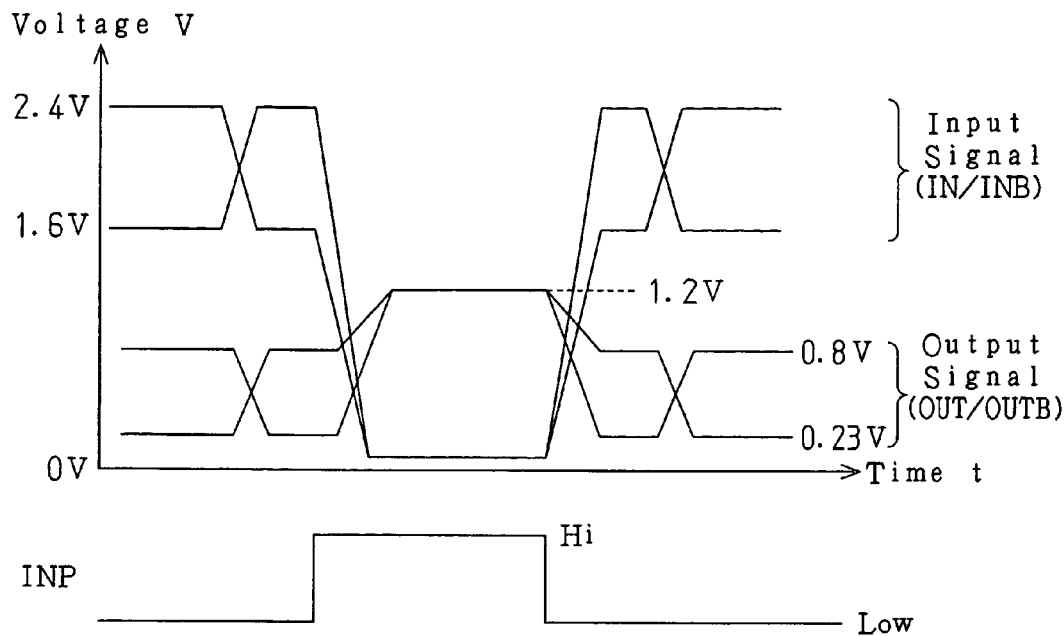
FIG. 13 is a waveform diagram showing signals of the level conversion circuit of FIG. 12.

FIG. 12 shows a level conversion circuit 11d incorporated in the semiconductor integrated circuit 10 of the sixth embodiment, and FIG. 13 shows the waveform of the level conversion circuit 11d.

The level conversion circuit 11d of the sixth embodiment is configured by adding two MOS transistors M11 and M12 and an inverter circuit 15 to the level conversion circuit 11b of the fourth embodiment. The MOS transistors M11 and M12 are P-type conduction transistors.

The source of the MOS transistor M11 is connected to the drain of the first MOS transistor M1 (first power supply VDD). The drain of the MOS transistor M11 is connected to the source of the first MOS transistor M1. The source of the MOS transistor M12 is connected to the drain of the third MOS transistor M3 (first power supply VDD). The drain of the MOS transistor M12 is connected to the source of the third MOS transistor M3. The inverter circuit 15 is connected between the terminal that receives the current restriction signal INP and the gates of the MOS transistors M11 and M12. The inverter circuit 15 inverts the current restriction signal INP and generates a signal having a phase inverted from the phase of the current restriction signal INP. The gates of the MOS transistors M11 and M12 receive the current restriction signal INP inverted by the inverter circuit 15.

In the fourth embodiment of FIG. 10, the high level current restriction signal INP inactivates the level conversion circuit 11b. In this state, the first to fourth MOS transistors M1 to M4 are inactivated, and the output of the level conversion circuit 11b (output signal OUT and OUTB) are set at high impedance. In this case, there is a problem in that direct tunneling current flows through the differential amplification circuit 12, which is in the next stage. In comparison, in the sixth embodiment, when the current restriction signal INP has a high level and inactivates the level conversion circuit 11d, the output of the level conversion circuit lid (output signals OUT and OUTB) is fixed at a voltage level that is the same as the voltage level of the first power supply VDD (1.2 V). The fixing of the voltage level ensures the inactivation of the PMOS transistors MP1 and MP2 (refer to FIG. 5) in the differential amplification circuit 12. This prevents direct tunneling current from flowing through the differential amplification circuit 12.

It should be apparent to those skilled in the art that the present invention may be embodied in many other specific forms without departing from the spirit or scope of the invention. Particularly, it should be understood that the present invention may be embodied in the following forms.

In the first embodiment, the ratios between the gate length and the gate width of the MOS transistors M1 and M3 are respectively equal to the ratios between the gate length and the gate width of the MOS transistors M2 and M4. However, the configuration of the MOS transistors M1 to M4 does not have to have such a configuration. For example, the ratio of the gate width W and the gate length L in the MOS transistors M1 to M4 may be such that the input circuit delay time that is in accordance with the level fluctuation of the input signals IN and INB is within the range of the interface standard.

Figure 14:
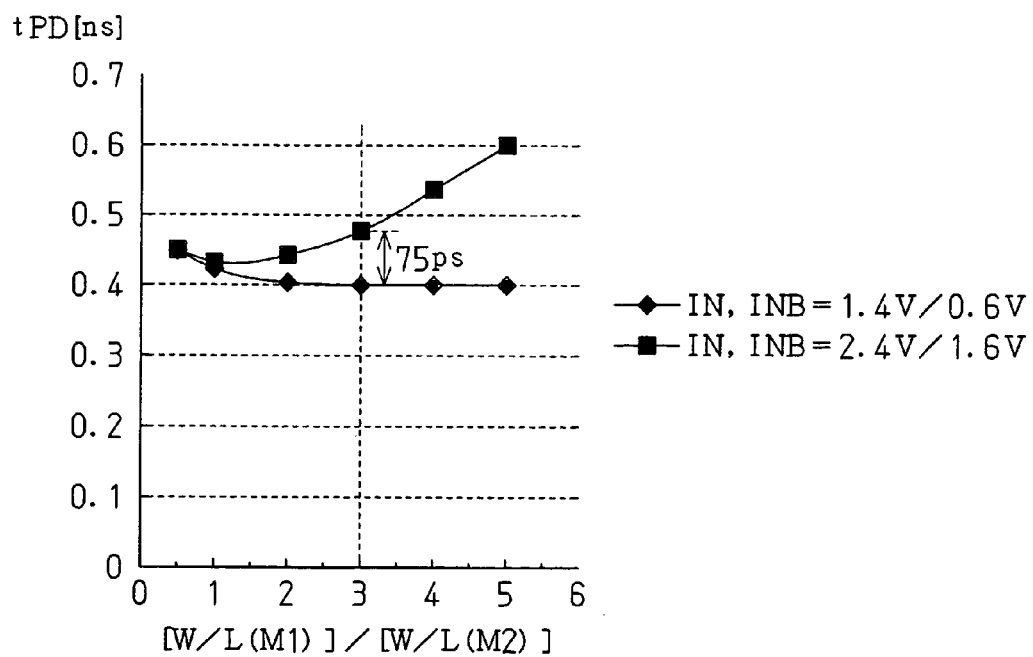
FIG. 14 is a graph showing the relationship between a ratio of the gate width relative to the gate length and the delay time of the input circuit.

FIG. 14 is a graph showing the relationship between the ratio of the gate length L and the gate width W (W/L) and the delay time tPD of the input circuit (circuit including the level conversion circuit 11 and the differential amplification circuit 12). In FIG. 14, the data obtained when the input signals IN and INB oscillate between 1.4 and 0.6 V and the data obtained when the input signals IN and INB oscillate between 2.4 V and 1.6 V are plotted. The horizontal axis of the graph in FIG. 14 represents the ratio W/L(M1) of the gate length L and the gate width W in the first MOS transistor M1 relative to the ratio W/L(M2) of the gate length L and the gate width W in the second MOS transistor M2.

As shown in FIG. 14, when the ratio W/L(M1) of the MOS transistor M1 is equal to the ratio W/L(M2) of the MOS transistor M2 (i.e., the value being one on the horizontal axis), the delay time tPD is substantially the same even if the levels (input levels) of the input signals IN and INB change. When the ratio W/L(M1) is 0.5 times the ratio W/L(M2), the delay time tPD is about the same even if the levels (input levels) of the input signals IN and INB change. As the ratio W/L(M1) becomes greater than the ratio W/L(M2), the time difference between the time delays tPD of different input signals increases. For example, when the ratio W/L(M1) is five times greater than W/L(M2), a time difference of 0.2 ns is produced between the time delays tPD.

In one example, an input circuit, which includes the level conversion circuit 11, receives input signal IN and INB having a frequency of 666 MHz and a duty ratio of 50%. Further, the input circuit is designed so that the duty ratio is within the standardized range of 50%±5%. In this case, one cycle of the input signal takes 1.5 ns, and 5% of one cycle is 75 ps. Thus, when the time difference between the delay times tPD of input signals having different input levels is 75 ps or less, the duty ratio is included in the standardized range of 50%±5%. In other words, it is preferable that the level conversion circuit 11 be designed so that the ratio W/L(M1) of the MOS transistor M1 is three times or less than the ratio W/L(M2) of the MOS transistor M2 as shown in FIG. 14. Such designing satisfies the interface standard of the semiconductor integrated circuit 10. Thus, the semiconductor integrated circuit 10 functions properly even when the levels of the input signals IN and INB fluctuate. The level conversion circuit 11 configured in this manner is not restricted to a circuit that receives the input signal INB of which phase is inverted from that of the input signal IN. For example, the level conversion circuit 11 may receive a reference voltage having a constant voltage instead of the input signal INB.

In the sixth embodiment of FIG. 12, the level conversion circuit 11d is configured so that the output terminals of the output signals OUT and OUTB are connected to the first power supply VDD when the level conversion circuit 11d is inactivated. However, the configuration of a level conversion circuit may be changed in accordance with the configuration of the differential amplification circuit 12. For example, when employing the differential amplification circuit 12a of FIG. 7, the level conversion circuit 11a is configured so that the output of the level conversion circuit 11a is connected to the second power supply VSS when inactivated.

In the above embodiments, the differential amplification circuit 12 is arranged in a stage subsequent to the level conversion circuit 11. However, the present invention may be applied to an input circuit in which a differential amplification circuit is arranged in a stage prior to the level conversion circuit 11.

The present examples and embodiments are to be considered as illustrative and not restrictive, and the invention is not to be limited to the details given herein, but may be modified within the scope and equivalence of the appended claims.

What is claimed is:

1. A semiconductor integrated circuit, comprising:
a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and
a differential amplification circuit, connected to the level conversion circuit, for functioning in accordance with the first and second output signals of the level conversion circuit and generating a differential amplification output siginal,
wherein the first and fourth MOS transistors each have a gate for receiving a first input signal, and the second and third MOS transistors each have a gate for receiving a second input signal having a phase inverted from the phase of the first input signal, and wherein the gate of each transistor has a gate length and a gate width, the ratio between the gate length and the gate width of one of the transistors in each pair of the series-connected MOS transistors is about three times or less than the ratio between the gate length and the gate width of the other one of the transistors in the pair of the series-connected MOS transistors such that fluctuation of a voltage level of the differential amplification output signal is suppressed and fluctuation of delay time of the differential amplification output signal is in a predetermined time period regardless of a change in voltage levels of the first and second input signals.

2. The semiconductor integrated circuit according to claim 1, wherein the gate of each transistor has a gate length and a gate width, and the ratio between the gate length and the gate width of one of the transistors in each pair of the series-connected MOS transistors is substantially the same as the ratio between the gate length and the gate width of the other one of the transistors in the pair of the series-connected MOS transistors.

3. The semiconductor integrated circuit according to claim 1, wherein each transistor has a gain constant, and the gain constant of one of the transistors in each pair of the series-connected MOS transistors is substantially the same as the gain constant of the other one of the transistors in the pair of the series-connected MOS transistors.

4. The semiconductor integrated circuit according to claim 1, wherein each transistor has a channel length modulation constant, and the channel length modulation constant of one of the transistors in each pair of the series-connected MOS transistors is substantially the same as the channel length modulation constant of the other one of the transistors in the pair of the series-connected MOS transistors.

5. The semiconductor integrated circuit according to claim 1, wherein the differential amplification circuit is connected between the first power supply and the second power supply.

6. The semiconductor integrated circuit according to claim 1, wherein the first to fourth MOS transistors each include a source and a back gate, which is connected to the source.

7. A semiconductor integrated circuit, comprising:
a level conversion circuit having a pair of transistors including a first MOS transistor and a second MOS transistor, connected in series between a first power supply and a second power supply, and a further pair of transistors including a third MOS transistor and a fourth MOS transistor connected in series between the first power supply and the second power supply, the level conversion circuit generating a first output signal from a node connecting the first and second MOS transistors and a second output signal from a node connecting the third and fourth transistors; and
a differential amplification circuit, connected to the level conversion circuit, for functioning in accordance with the first and second output signals of the level conversion circuit,
wherein the first and fourth MOS transistors each have a gate for receiving a first input signal, and the second and third MOS transistors each have a gate for receiving a second input signal having a phase inverted from the phase of the first input signal, and wherein the differential amplification circuit includes a plurality of MOS transistors, each having a gate provided with a predetermined gate voltage capacity, the semiconductor device further comprising:

a fifth MOS transistor connected between the differential amplification circuit and the node connecting the first and second MOS transistors; and
a sixth MOS transistor connected between the differential amplification circuit and the node connecting the third and fourth MOS transistors, the fifth and sixth MOS transistors each having a gate to which voltage less than the gate voltage capacity of each MOS transistor in the differential amplification circuit is applied.

8. A semiconductor integrated circuit, comprising:
a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and
a differential amplification circuit, connected to the level conversion circuit, for functioning in accordance with the first and second output signals of the level conversion circuit,
wherein the first and fourth MOS transistors each have a gate for receiving a first input signal, and the second and third MOS transistors each have a gate for receiving a second input signal having a phase inverted from the phase of the first input signal, and wherein the level conversion circuit includes:
a fifth MOS transistor having a gate for receiving a current restriction signal, a source connected to one of the first and second power supplies, and a drain connected to the gates of the first and fourth MOS transistors;
a sixth MOS transistor having a gate for receiving the current restriction signal, a source connected to one of the first and second power supplies, and a drain connected to the gates of the second and third MOS transistors.

9. The semiconductor integrated circuit according to claim 8, wherein the level conversion circuit includes:
a seventh MOS transistor, connected to one of the first and second power supplies, for fixing voltage to a predetermined value at the node connecting the first MOS transistor and the second MOS transistor; and
an eighth MOS transistor, connected to one of the first and second power supplies, for fixing voltage to a predetermined value at the node connecting the third MOS transistor and the fourth MOS transistor.

10. A semiconductor integrated circuit, comprising:
a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and
a differential amplification circuit, connected to the level conversion circuit, for functioning in accordance with the first and second output signals of the level conversion circuit, wherein the first and fourth MOS transistors each have a gate for receiving a first input signal, and the second and third MOS transistors each have a gate for receiving a second input signal having a phase inverted from the phase of the first input signal, and wherein the first to fourth MOS transistors are each N-type conduction transistors, and potential at one of the first and second power supplies is lower than potential at the other one of the first and second power supplies, the level conversion circuit including:

an N-type fifth MOS transistor having a gate for receiving a current restriction signal, a source connected to the one of the first and second power supplies at which the potential is lower, and a drain connected to the gates of the first and fourth MOS transistors; and an N-type sixth MOS transistor having a gate for receiving the current restriction signal, a source connected to the one of the first and second power supplies at which the potential is lower, and a drain connected to the gates of the second and third MOS transistors.

11. A semiconductor integrated circuit, comprising:

a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and a differential amplification circuit, connected to the level conversion circuit, for functioning in accordance with the first and second output signals of the level conversion circuit, wherein the first and fourth MOS transistors each have a gate for receiving a first input signal, and the second and third MOS transistors each have a gate for receiving a second input signal having a phase inverted from the phase of the first input signal, and wherein the first to fourth MOS transistors are each P-type conduction transistors, and potential at one of the first and second power supplies is greater than potential at the other one of the first and second power supplies, the level conversion circuit including:

a P-type fifth MOS transistor having a gate for receiving a current restriction signal, a source connected to the one of the first and second power supplies at which the potential is greater, and a drain connected to the gates of the first and fourth MOS transistors; and a P-type sixth MOS transistor having a gate for receiving the current restriction signal, a source connected to the one of the first and second power supplies at which the potential is greater, and a drain connected to the gates of the second and third MOS transistors.

12. A semiconductor integrated circuit, comprising:

a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and a differential amplification circuit, connected to the level conversion circuit, for functioning in accordance with the first and second output signals of the level conversion circuit, wherein the first and fourth MOS transistors each have a gate for receiving a first input signal, and the second and third MOS transistors each have a gate for receiving a second input signal having a phase inverted from the phase of the first input signal, and wherein the differential amplification circuit includes a plurality of MOS transistors, each provided with a predetermined gate voltage capacity, the first to fourth MOS transistors of the level conversion circuit each being provided with a gate voltage capacity that is greater than the gate voltage capacity of each MOS transistor in the differential amplification circuit.

13. A semiconductor integrated circuit, comprising:

a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and a differential amplification circuit, connected to the level conversion circuit, for functioning in accordance with the first and second output signals of the level conversion circuit, wherein the first and fourth MOS transistors each have a gate for receiving a first input signal, and the second and third MOS transistors each have a gate for receiving a second input signal having a phase inverted from the phase of the first input signal, and wherein potential at one of the first and second power supplies is greater than potential at the other one of the first and second power supplies, and the differential amplification circuit is connected to the one of the first and second power supplies at which the potential is greater;

wherein the differential amplification circuit includes a plurality of MOS transistors, each provided with a predetermined gate voltage capacity, the first to fourth MOS transistors of the level conversion circuit each being provided with a gate voltage capacity that is greater than the gate voltage capacity of each MOS transistor in the differential amplification circuit; and wherein the level conversion circuit receives an input signal having voltage greater than the greater one of the potentials at the first and second power supplies.

14. A semiconductor integrated circuit comprising:

a level conversion circuit having a pair of transistors including a first MOS transistor and a second MOS transistor, connected in series between a first power supply and a second power supply, and a further pair of transistors including a third MOS transistor and a fourth MOS transistor, connected in series between the first power supply and the second power supply, the level conversion circuit generating a first output signal from a node connecting the first and second MOS transistors and a second output signal from a node connecting the third and fourth transistors; and a differential amplification circuit, connected to the level conversion circuit, for functioning in accordance with the first and second output signals of the level conversion circuit and generating a differential amplification output signal, wherein the gate of each transistor has a gate length and a gate width, the ratio between the gate length and the gate width of one of the transistors in each pair of the series-connected MOS transistors is about three times or less than the ratio between the gate length and the gate width of the other one of the transistors in each pair of the series-connected MOS transistors such that fluctuation of a voltage level of the differential amplification output signal is suppressed and fluctuation of delay time of the differential amplification output signal is in a predetermined time period regardless of a change in voltage levels of the first and second input signals.

15. The semiconductor integrated circuit according to claim 14, wherein the first and fourth MOS transistors each receive a first input signal, and the second and third MOS transistors each receive a second input signal having a phase inverted from the phase of the first input signal.

* * * * *